United States Patent [19]

Secco d'Aragona et al.

[11] Patent Number: 6,113,721
[45] Date of Patent: Sep. 5, 2000

[54] METHOD OF BONDING A SEMICONDUCTOR WAFER

[75] Inventors: Frank T. Secco d'Aragona, Scottsdale; David D. Oliver, Phoenix; Raymond C. Wells, Scottsdale, all of Ariz.

[73] Assignee: Motorola, Inc., Schaumburg, Ill.

[21] Appl. No.: 08/368,078

[22] Filed: Jan. 3, 1995

[51] Int. Cl.[7] .............................. B32B 31/00; H01L 21/46
[52] U.S. Cl. ........................... 156/154; 156/281; 438/455
[58] Field of Search ..................................... 156/153, 154, 156/281; 437/225, 921, 974; 148/DIG. 12, DIG. 135; 438/455, 459

[56] References Cited

U.S. PATENT DOCUMENTS 3,567,547  3/1971  Mattson et al. .
5,087,307  2/1992  Nomura et al. ...................... 156/153 X
5,097,630  3/1992  Maeda et al. .
5,152,857  10/1992  Ito et al. .
5,274,959  1/1994  Dyer et al. .
5,340,435  8/1994  Ito et al. ................................ 156/281

OTHER PUBLICATIONS

Webster's New Collegiate Dictionary, G & C Merriam Company, Springfield, MA, 1977, p. 647.

*Primary Examiner*—Jeff H. Aftergut
*Attorney, Agent, or Firm*—Miriam Jackson; Robert F. Hightower

[57] ABSTRACT

Removing a portion of an active wafer (12) at the edge (18) after the active wafer (12) is bonded to a base wafer (10) prevents chipping of the edge of the active wafer during thinning of the active wafer (12). Grinding and polishing of the edges of the active wafer (12) is preferably performed.

19 Claims, 1 Drawing Sheet

METHOD OF BONDING A SEMICONDUCTOR WAFER

BACKGROUND OF THE INVENTION

This invention relates to, in general, a method of bonding semiconductor wafers, and more particularly, a method of bonding edge rounded semiconductor wafers of the same size.

Typically, semiconductor wafers are provided having the edges rounded to prevent "crowning" when an epitaxial layer is grown on the surface of the substrate. These wafers are typically 500 microns thick. In this technology, the two wafers, an active wafer on which semiconductor devices will be fabricated and a handle wafer to provide support, are bonded to provide a means for isolation or for bonding two dissimilar materials.

After bonding the exposed surface of active wafer is polished back to a thickness of 2–40 microns. Because of the edges of the wafer were rounded, this polishing step left remaining a small portion of the active wafer at the perimeter which was not in physical contact with the handle wafer. This portion would fracture later in the process or in the polishing step, causing polish scratches or contamination.

Prior art methods have been used to solve the problem stated above. One such method involves using photolithography and etch techniques to remove a perimeter portion of the active wafer after bonding. However, this technique is costly and adds cycle time to the process. Another method involves reducing the diameter of the active wafer before bonding to the handle wafer. The disadvantage of this method is that bonding of two different size wafers is more difficult. In addition, it is believed that the problem would not be solved, because the reduced diameter wafer would be preferably polished after the diameter is reduced to relieve stress in the wafer. The polishing creates a rounded surface at the edges that will not be in physical contact with the handle wafer after bonding, because the bonding surface of the handle wafer will be level, but the bonding surface of the active wafer will not be level. If the polishing step is not performed after reduction of the diameter, then defects will be created later in the process.

As can be seen, it would be desirable to have a method of bonding two wafers without the chipping of the edges of the active wafer. This method should desirably be inexpensive and easier to perform than the methods that are presently available.

DETAILED DESCRIPTION OF THE DRAWINGS

Figure 1:
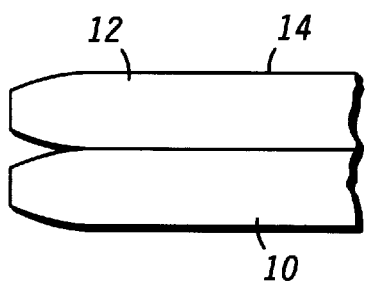
FIG. 1 illustrates an enlarged portion of a cross-section of an embodiment of the present invention in a beginning stage of fabrication.

FIG. 1 illustrates an enlarged portion of a cross-section of an embodiment of the present invention after bonding of two wafers. A base wafer 10 is bonded to an active wafer 12. Base wafer 10 and active wafer 12 have first and second major surfaces and have rounded edges. Active wafer 12 has an exposed surface 14 after bonding. Active wafer 12 and base wafer 10 can be comprised of any semiconductor materials, or combinations thereof, including, for example, silicon, polysilicon, or gallium arsenide, with or without an insulating layer formed thereon prior to bonding. The method of bonding is well known in the art.

Figure 2:
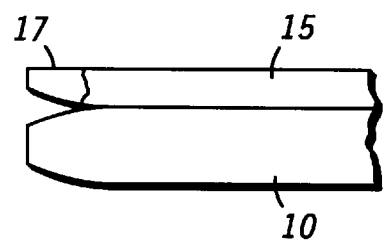
FIG. 2 illustrates an enlarged portion of a cross-section of the prior art in a later stage of fabrication.

FIG. 2 illustrates a prior art method. After the bonding step illustrated in FIG. 1, active wafer 12 is thinned starting from surface 14 so that active wafer 12 is of a thickness of approximately 2–40 microns. After active wafer 12 is thinned, a portion 17 near the edge of the bonded wafers is left remaining. This portion 17 breaks off during subsequent processing.

Figure 3:
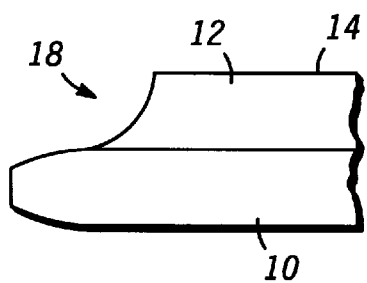
FIG. 3 illustrates the embodiment of FIG. 1 further along in processing.

FIG. 3 illustrates the structure of FIG. 1 further along in processing in accordance with one embodiment of the present invention. After bonding, a portion of active wafer 12 at the edges is removed. Preferably, a mechanical grind is used. Preferably, a diamond-plated grind wheel is used in the grinding process.

The grinding at edge 18 must remove substantially all of the portion of active wafer 12 that is not supported by or not bonded to base wafer 10. Typically, edge rounding stops at 1.5–2.5 millimeters from the edge of active wafer 12 and base wafer 10. Thus, a portion of active wafer 12 must be removed so that the surface to base wafer 10 is ground back at least approximately 1.5 millimeters so that substantially all of the surface of active wafer 12 is in physical contact with a surface of base wafer 10. Substantially all is defined as enough material of active wafer 12 so that no significant material of active wafer 12 is left to chip off during the subsequent thinning back of active wafer 12. More preferably, one and one-half times the length that the edges are rounded is removed in order to allow for process tolerances.

Figure 4:
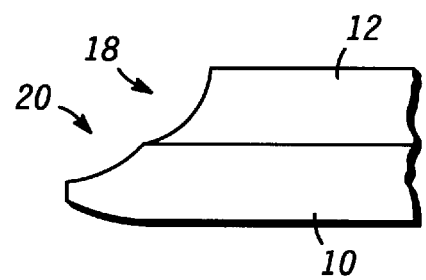
FIG. 4 illustrates the embodiment of FIG. 1 further along in processing using an alternate method of the present invention.

FIG. 4 illustrates an alternate embodiment of the present invention. In addition to grinding active wafer 12, base wafer 10 is ground at the edge. This step is not required, but with the present equipment available, controlling the removal of active wafer 12 to stop without removing some portion of base wafer 10 is difficult. If a portion of base wafer 10 is removed, then a chemical etch is preferably performed to remove damage created to base wafer 10. Any suitable etchant of the semiconductor material may be used.

Figure 5:
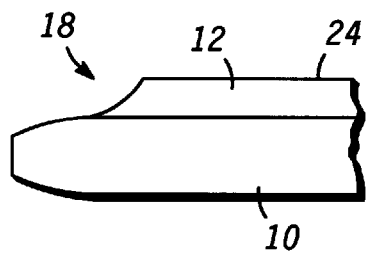
FIG. 5 illustrates an enlarged portion of a cross-section of FIG. 3 further along in processing.

FIG. 5 illustrates the structure of FIG. 3 further along in processing. The structure of FIG. 4 may be processed in the same way, but only the structure of FIG. 3 is illustrated for convenience. Surface 14 of active wafer 12 is thinned to a thickness less than the starting thickness. Typically, this thickness is in the range of 2–40 microns. If the thickness is less than approximately 2 microns, the subsequent polish step removes any small chips without scratching of the surface of active wafer 12. If the thickness is more than approximately 40 microns, then the unbonded portion of active wafer 12 is thick enough that it will not break off. This invention is thus useful when active wafer 12 will be thinned within the range of approximately 2–40 microns to prevent the chipping of the edges of active wafer 12. The thinning process may be performed before the edge grinding process.

Preferably, active wafer 12 is thinned by a grinding step. Subsequently, a polishing step is performed. Preferably, a polyurethane pad with a colloidal silica slurry is used. The polishing process is performed after grinding in order to remove the damage on active wafer 12 created by the grinding process.

As can be seen, by using the process of the present invention, active wafer 12 does not have an edge that can break off. The grinding and polishing process is not as expensive as a photolithography and etch process.

What is claimed is:

1. A method of bonding two wafers, comprising the steps of:

providing an first wafer having a first major surface and a second major surface and having a rounded edge;

providing a second wafer having a first major surface and a second major surface and having a rounded edge;

bonding the first wafer and the second wafer so that the first major surface of the second wafer is adjacent the second major surface of the first wafer; and removing a portion of the first wafer from the round edge into a portion of the first wafer by grinding so that the second major surface of the first wafer is supported by the first major surface of the second wafer, after the step of bonding, and wherein the diameter of the second wafer remains essentially the same.

2. The method of claim 1 further comprising removing a portion of the second wafer at the rounded grinding and chemically etching a portion of the second wafer.

3. The method of claim 1 further comprising the step of polishing the first wafer after the step of removing a portion of the first wafer.

4. The method of claim 1 wherein the step of removing a portion of the first wafer comprises using a diamond-plated grind wheel.

5. The method of claim 1 further comprising the steps of:

removing a portion of the second wafer from the rounded edge into a portion of the second wafer.

6. The method of claim 1 wherein the step of removing a portion of the first wafer comprises removing at least 1.5 millimeters from the rounded edge into a portion of the first wafer.

7. The method of claim 1 wherein the rounded edge of the first wafer has a length and the step of removing a portion of the first wafer comprises removing one and one-half times the length of the rounded edge from the rounded edge into a portion of the first wafer.

8. The method of claim 1 further comprising the step of thinning the first wafer from the first major surface.

9. A method of bonding two wafers, comprising the steps of:

providing an active wafer having a first major surface and a second major surface and having a rounded edge;

providing a base wafer having a first major surface and a second major surface and having a rounded edge;

bonding the active wafer and the base wafer so that the first major surface of the base wafer is adjacent the second major surface of the active wafer;

grinding away a portion of the active wafer from the rounded edge into a portion of the active wafer so that substantially all of the second major surface of the active wafer is in physical contact with the first major surface of the base wafer, after the step of bonding, and wherein the diameter of the base wafer is not substantially altered; and thinning the active wafer from the first major surface.

10. The method of claim 9 further comprising removing a portion of the base wafer at the rounded edge by grinding and chemically etching a portion of the base wafer.

11. The method of claim 9 further comprising polishing the active wafer after the step of grinding.

12. The method of claim 9 wherein the step of grinding away a portion of the active wafer further comprises using a diamond-plated grind wheel.

13. The method of claim 9 wherein the step of grinding away a portion of the active wafer comprises removing at least 1.5 millimeters from the rounded edge into a portion of the active wafer.

14. The method of claim 9 further comprising the step of:

removing a portion of the base wafer from the rounded edge into a portion of the base wafer.

15. The method of claim 9 wherein the step of grinding away a portion of the active wafer comprises removing substantially all of a portion of the active wafer which is unbonded to the base wafer.

16. A method of bonding two semiconductor wafers, comprising the steps of:

providing an active wafer having a first major surface and a second major surface and having a rounded edge;

providing a base wafer having a first major surface and a second major surface and having a rounded edge;

bonding the active wafer and the base wafer so that the first major surface of the base wafer is adjacent the second major surface of the active wafer;

mechanically removing a portion of the active wafer from the rounded edge into a portion of the active wafer so that substantially all of the second major surface of the active wafer is in physical contact with the first major surface of the base wafer, after the step of bonding, and wherein the diameter of the base wafer is not substantially altered; and thinning the active wafer from the first major surface down into a portion of the active wafer.

17. The method of claim 16 further comprising polishing the active wafer after the step of thinning the active wafer.

18. The method of claim 16 further comprising the step of:

removing a portion of the base wafer from the rounded edge into a portion of the base wafer.

19. The method of claim 16 wherein the step of thinning the active wafer comprises thinning the active wafer to a thickness of approximately 2–40 microns.

* * * * *

UNITED STATES PATENT AND TRADEMARK OFFICE
CERTIFICATE OF CORRECTION

PATENT NO.   : 6,113,721
DATED        : September 5, 2000
INVENTOR(S)  : Frank T. Secco d'Aragona et al.

It is certified that error appears in the above-identified patent and that said Letters Patent is hereby corrected as shown below:

Column 3,
Line 16, delete "round" and replace with -- rounded --.
Line 22, after "rounded" add -- edge by --.

Signed and Sealed this

Sixteenth Day of July, 2002

*Attest:*

*Attesting Officer*

JAMES E. ROGAN
*Director of the United States Patent and Trademark Office*